US010163549B2

(12) United States Patent
Kurihara

(10) Patent No.: US 10,163,549 B2
(45) Date of Patent: Dec. 25, 2018

(54) OXIDE SUPERCONDUCTING WIRE

(71) Applicant: FUJIKURA LTD., Tokyo (JP)

(72) Inventor: Chihaya Kurihara, Sakura (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 0 days.

(21) Appl. No.: 14/762,348

(22) PCT Filed: Feb. 13, 2014

(86) PCT No.: PCT/JP2014/053320
§ 371 (c)(1),
(2) Date: Jul. 21, 2015

(87) PCT Pub. No.: WO2014/126149
PCT Pub. Date: Aug. 21, 2014

(65) Prior Publication Data
US 2015/0357092 A1  Dec. 10, 2015

(30) Foreign Application Priority Data
Feb. 15, 2013 (JP) .................. 2013-028222

(51) Int. Cl.
*H01B 12/06* (2006.01)
*H01F 6/06* (2006.01)
*H01L 39/14* (2006.01)

(52) U.S. Cl.
CPC .............. *H01B 12/06* (2013.01); *H01F 6/06* (2013.01); *H01L 39/143* (2013.01)

(58) Field of Classification Search
CPC .................. H01B 12/06; H01F 6/06
See application file for complete search history.

(56) References Cited

U.S. PATENT DOCUMENTS 5,296,459 A * 3/1994 Negm ................ C23C 26/00
427/123
5,932,523 A  8/1999 Fujikami et al.
(Continued)

FOREIGN PATENT DOCUMENTS

JP      7-335051 A    12/1995
JP  2009-503794 A     1/2009
(Continued)

OTHER PUBLICATIONS

Japanese Office Action of JP 2014-542435 dated Nov. 4, 2014.
(Continued)

*Primary Examiner* — Paul A Wartalowicz
(74) *Attorney, Agent, or Firm* — Sughrue Mion, PLLC

(57) ABSTRACT

An oxide superconducting wire wherein an outer periphery of an oxide superconductor is covered with a plating layer (stabilizing layer). In addition, the oxide superconductor includes: an oxide superconducting laminate that is formed by a tape-shaped substrate, an interlayer, and an oxide superconducting layer, in which the interlayer and the oxide superconducting layer are laminated on a main surface of the substrate; and an undercoat stabilizing layer that is laminated on an outer periphery of the oxide superconducting laminate. The undercoat stabilizing layer includes: a first undercoat stabilizing layer formed of Ag or an Ag alloy; and a second undercoat stabilizing layer formed of one of Cu, Ni, Pb, Bi, and an alloy containing Cu, Ni, Pb or Bi as a major component.

10 Claims, 4 Drawing Sheets

(56) References Cited

U.S. PATENT DOCUMENTS

| | | | |
|---|---|---|---|
| 2002/0182773 A1* | 12/2002 | Su | H01L 23/49531 438/111 |
| 2005/0016759 A1* | 1/2005 | Malozemoff | H01L 39/02 174/125.1 |
| 2006/0073979 A1* | 4/2006 | Thieme | H01L 39/143 505/434 |
| 2008/0108506 A1* | 5/2008 | Kraemer | H01L 39/16 505/237 |
| 2009/0088326 A1* | 4/2009 | Baecker | C23C 18/08 505/434 |
| 2009/0298696 A1* | 12/2009 | Otto | H01L 39/02 505/230 |
| 2010/0075857 A1* | 3/2010 | Ayai | H01L 39/248 505/230 |
| 2014/0323314 A1* | 10/2014 | Takemoto | H01L 39/143 505/230 |

FOREIGN PATENT DOCUMENTS

| | | | | |
|---|---|---|---|---|
| JP | 2010-218730 A | 9/2010 | | |
| JP | 2011-159455 A | 8/2011 | | |
| JP | 2012-43734 A | 3/2012 | | |
| JP | 2012-216504 A | 11/2012 | | |
| RU | 2099806 C1 | 12/1997 | | |
| WO | 2007/016492 A2 | 2/2007 | | |
| WO | WO 2013/077387 | * | 5/2013 | C01G 3/00 |

OTHER PUBLICATIONS

Japanese Notice of Allowance of JP 2014-542435 dated Dec. 19, 2014.

Communication dated Sep. 19, 2016 from the European Patent Office in counterpart application No. 14752220.5.

Communication dated Nov. 11, 2016, from the Russian Patent Office in counterpart application No. 2015134130.

Communication dated Apr. 5, 2017 from the European Patent Office issued in counterpart application No. 14752220.5.

* cited by examiner

OXIDE SUPERCONDUCTING WIRE

TECHNICAL FIELD

The present invention relates to an oxide superconducting wire.

This application is a National Stage of International Application No. PCT/JP2014/053320 filed Feb. 13, 2014, claiming priority based on Japanese Patent Application No. 2013-028222, filed Feb. 15, 2013, the contents of all of which are incorporated herein by reference in their entirety.

BACKGROUND ART

Examples of high-efficiency and low-current-loss electric apparatuses capable of solving recent problems in energy, the environment, and resources include superconducting apparatuses such as a cable, a coil, a motor, and a magnet in which a superconductor is used as a low-current-loss material. As a superconductor used in these superconducting apparatuses, for example, an oxide superconductor such as a RE-123-based oxide superconductor ($REBa_2Cu_3O_{(7-x)}$: RE represents a rare-earth element such as Y or Gd) is known. This oxide superconductor exhibits superconducting characteristics at about a liquid nitrogen temperature and can maintain a relatively high critical current density even in a ferromagnetic field. Therefore, it is considered that the oxide superconductor can be applied to a wider range as compared to other superconductors, and the oxide superconductor is expected to be a practically promising material.

In order for the oxide superconductor to be used in an electric apparatus, in general, the oxide superconductor is processed into a wire to be used as an oxide superconducting wire such as a power supply conductor or a magnetic coil. The oxide superconducting wire is formed by forming an oxide superconducting layer on a tape-shaped substrate with an interlayer interposed therebetween.

It is known that, when the oxide superconductor is placed in a high-humidity environment, a crystal structure thereof is disordered due to an influence of moisture, and superconducting characteristics decrease. Therefore, it is necessary to protect the oxide superconducting layer from moisture. To that end, a technique of protecting the oxide superconducting layer from moisture by forming an undercoat stabilizing layer containing Ag thereon is known.

Ag is a relatively expensive metal, and thus less Ag used, the better. Therefore, the undercoat stabilizing layer containing Ag formed is thin. However, when the undercoat stabilizing layer of Ag is thin, satisfactory moisture resistance may not be obtained, and thus various structures are provided.

For example, a structure is known, in which an oxide superconducting layer is formed on a substrate with an interlayer interposed therebetween to obtain a laminate, an undercoat stabilizing layer is formed on the oxide superconducting layer of the laminate, and a stabilizing layer of Cu or the like is formed on an outer periphery of the laminate including the undercoat stabilizing layer using an electroplating method to liquid-tightly seal the outer periphery of the oxide superconducting wire.

However, the current densities flowing through the respective layers constituting the oxide superconducting wire are not the same because they depend on the respective electrical resistances thereof. Accordingly, there is a problem in that the thickness of the stabilizing layer is not uniform. In addition, a Ni-based alloy (for example, HASTELLOY: trade name, manufactured by Haynes International, Inc.), which is known to be preferable as a material of a substrate, is known as a material on which it is difficult to form a plating layer. Even when a Cu plating layer is formed on a Ni-based alloy, the Cu plating layer (stabilizing layer) may be peeled off due to poor adhesion.

Therefore, PTL 1 discloses a technique of forming a stabilizing layer having a uniform thickness by completely covering an outer periphery of a laminate with an undercoat stabilizing layer containing Ag, and providing a Cu stabilizing layer on the undercoat stabilizing layer using a plating method, the laminate including: a substrate; and an oxide superconducting layer that is formed on the substrate with an interlayer interposed therebetween.

PRIOR ART DOCUMENTS

Patent Documents

[PTL 1] Japanese Unexamined Patent Application, First Publication No. H7-335051

DISCLOSURE OF INVENTION

Problem to be Solved by Invention

However, in the technique disclosed in PTL 1, it is necessary to form the undercoat stabilizing layer formed of Ag on the entire outer periphery of the laminate. In this case, when the undercoat stabilizing layer formed of Ag undergoes a heat treatment (oxygen annealing treatment) of supplying oxygen to the oxide superconducting layer in the subsequent process to improve superconducting characteristics, it is necessary for the undercoat stabilizing layer to have a predetermined thickness or more to limit the formation of a pinhole caused by Ag aggregation. As a result, the amount of Ag used increases, and there is a problem in that the cost increases.

Accordingly, an object of the present invention is to provide an oxide superconducting wire capable of limiting the amount of Ag used and ensuring the adhesion with a stabilizing layer to prevent a decrease in superconducting characteristics due to moisture.

Means for Solving the Problems

For solving the above-described problems, an oxide superconducting wire according to an aspect of the present invention includes: an oxide superconducting laminate that includes a substrate, an interlayer, and an oxide superconducting layer, in which the interlayer is formed on a main surface of the substrate, and the oxide superconducting layer is formed on the interlayer; an undercoat stabilizing layer that includes a first undercoat stabilizing layer and a second undercoat stabilizing layer and is formed on an outer periphery of the oxide superconducting laminate, in which the first undercoat stabilizing layer is formed of Ag or a Ag alloy so as to cover at least an upper surface of the oxide superconducting layer, and the second undercoat stabilizing layer is formed of Cu, Ni, Pb, Bi, or an alloy containing Cu, Ni, Pb or Bi as a major component so as to cover at least a portion of the outer periphery of the oxide superconducting laminate which is not covered with the first undercoat stabilizing layer; and a stabilizing layer that is formed on the undercoat stabilizing layer so as to cover at least a portion of the first undercoat stabilizing layer and a portion of the second undercoat stabilizing layer in the undercoat stabilizing layer.

In the oxide superconducting wire according to the above-described aspect, the undercoat stabilizing layer is formed on the outer periphery of the oxide superconducting laminate, and the stabilizing layer is formed on the undercoat stabilizing layer. The undercoat stabilizing layer includes: the first undercoat stabilizing layer formed of Ag or an Ag alloy; and the second undercoat stabilizing layer formed of one of Cu, Ni, Pb, Bi, and an alloy containing Cu, Ni, Pb or Bi as a major component. The first and second undercoat stabilizing layers have superior adhesion with a plating layer or a solder layer.

Accordingly, when a plating layer is provided as the stabilizing layer, the plating layer having high adhesion and a uniform thickness can be formed.

In addition, when a metal tape is used as the stabilizing layer and is joined through a solder layer, the stabilizing layer having high air-tightness can be formed.

Furthermore, in addition to the first undercoat stabilizing layer formed of Ag or an Ag alloy, the second undercoat stabilizing layer formed of one of Cu, Ni, Pb, Bi, and an alloy containing Cu, Ni, Pb or Bi as a major component is also provided. Therefore, the amount of Ag used can be limited. Accordingly, the cost can be reduced.

In addition, the first undercoat stabilizing layer may be formed on the oxide superconducting layer, the second undercoat stabilizing layer may be formed on a back surface of the substrate, and the first undercoat stabilizing layer and the second undercoat stabilizing layer may be formed to partially overlap each other on a side surface of the oxide superconducting laminate.

In the oxide superconducting wire according to the above-described aspect, the second undercoat stabilizing layer is formed of one of Cu, Ni, Pb, Bi, and an alloy containing Cu, Ni, Pb or Bi as a major component on a portion of the outer periphery of the oxide superconducting laminate on the back surface side of the substrate, and the first undercoat stabilizing layer formed of Ag is not formed on the entire outer periphery. Therefore, as compared to a structure in which the entire outer periphery is covered with an undercoat stabilizing layer formed of Ag, the amount of Ag used can be limited, and the cost can be limited. In addition, the side surface of the oxide superconducting laminate is covered with the first undercoat stabilizing layer and the second undercoat stabilizing layer which are formed to partially overlap each other. Therefore, moisture infiltration from the side surface can be limited, and a decrease in superconducting characteristics can be limited.

In addition, the second undercoat stabilizing layer may be formed to cover an entire exposed surface of the first undercoat stabilizing layer.

In the oxide superconducting wire according to the above-described aspect, the first undercoat stabilizing layer formed of Ag or an Ag alloy is covered with the second undercoat stabilizing layer formed of one of Cu, Ni, Pb, Bi, and an alloy containing Cu, Ni, Pb or Bi as a major component. Therefore, even when a pinhole is formed on the first undercoat stabilizing layer by an oxygen annealing treatment after the formation of the first undercoat stabilizing layer, the pinhole can be covered with the second undercoat stabilizing layer, and moisture infiltration can be reliably prevented.

In addition, when the first undercoat stabilizing layer formed of Ag or an Ag alloy is in direct contact with a solder layer, the first undercoat stabilizing layer is embedded with a metal material constituting the solder layer, which may increase an interface resistance value between the first undercoat stabilizing layer and the oxide superconducting layer. When this interface resistance value increases, the resistance during current supply from a current lead or the like to the oxide superconducting wire may be increased, or it is difficult to commutate the current of the oxide superconducting layer to the stabilizing layer during transition to a normal conducting state caused by quenching. As a result, the oxide superconducting wire may be burnt out.

On the other hand, in the oxide superconducting wire according to the above-described aspect, when the outer periphery of the undercoat stabilizing layer is covered with a metal tape (stabilizing layer) with a solder layer interposed therebetween, the first undercoat stabilizing layer is not in direct contact with the solder layer because the first undercoat stabilizing layer is covered with the second undercoat stabilizing layer. Accordingly, since the first undercoat stabilizing layer is not in direct contact with the solder layer, an increase in the interface resistance value between the first undercoat stabilizing layer and the oxide superconducting layer can be limited.

In addition, a thickness of the first undercoat stabilizing layer on the upper surface of the oxide superconducting layer may be 0.1 μm to 2 μm.

In the oxide superconducting wire according to the above-described aspect, the exposure of a portion of the oxide superconducting layer due to a pinhole, which is formed on the first undercoat stabilizing layer by a heat treatment during oxygen annealing, can be avoided, and the amount of Ag used can be limited, Therefore, the cost can be reduced.

In addition, the stabilizing layer may be a plating layer or a metal tape.

In the oxide superconducting wire according to the above-described aspect, a decrease in superconducting characteristics caused by moisture infiltration can be limited due to the above-described configuration.

Effects of the Invention

In the oxide superconducting wire according to the above-described aspect, the entire outer periphery of the oxide superconducting laminate is covered with the first undercoat stabilizing layer formed of Ag or an Ag alloy and the second undercoat stabilizing layer formed of one of Cu, Ni, Pb, Bi, and an alloy containing Cu, Ni, Pb or Bi as a major component. Therefore, moisture infiltration to the oxide superconducting layer of the oxide superconducting laminate can be limited, and a decrease in superconducting characteristics can be limited.

Furthermore, in addition to the first undercoat stabilizing layer formed of Ag or an Ag alloy, the second undercoat stabilizing layer formed of one of Cu, Ni, Pb, Bi, and an alloy containing Cu, Ni, Pb or Bi as a major component is also provided. Therefore, the amount of Ag used can be limited. As a result, the cost can be reduced.

EMBODIMENTS FOR CARRYING OUT THE INVENTION

Figure 1:
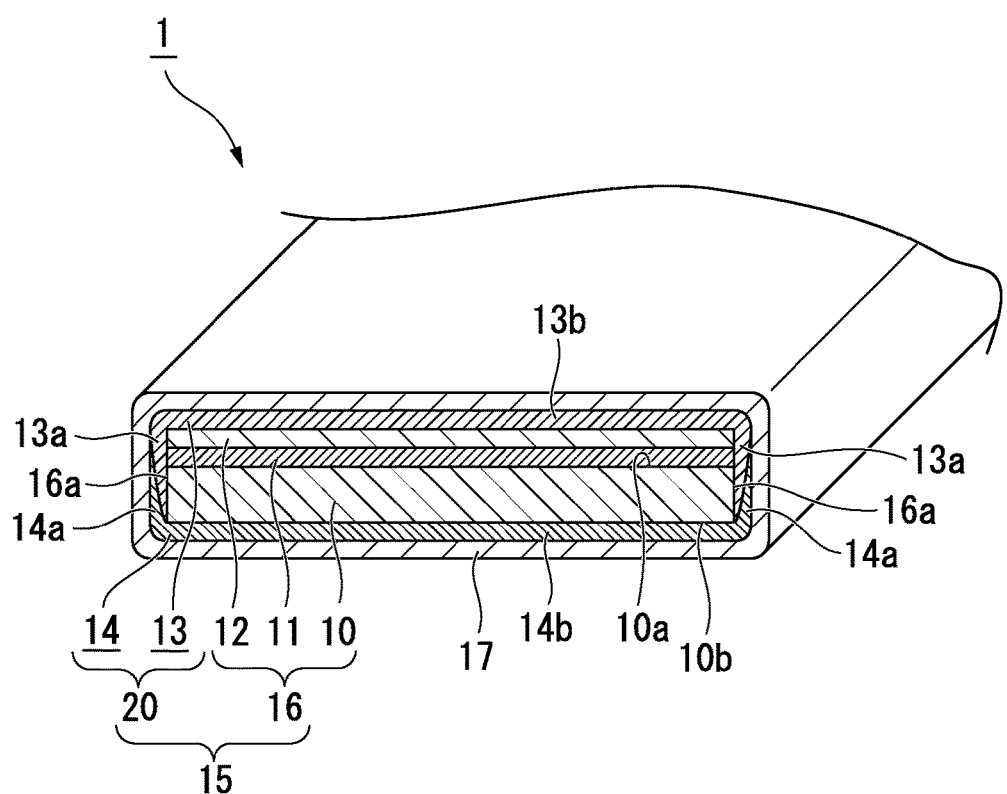
FIG. 1 is a cross-sectional view schematically showing an oxide superconducting wire according to a first embodiment of the present invention.

Hereinafter, oxide superconducting wires according to embodiments of the present invention will be described based on the drawings. In the drawings referred to in the following description, in order to make characteristics easily understood, characteristic portions are enlarged and shown, and the dimensional ratios and the like between the respective components are not exactly the same as those between actual components. In addition, the present invention is not limited to the following embodiments.

First Embodiment of Oxide Superconducting Wire

FIG. 1 shows an oxide superconducting wire 1 according to a first embodiment of the present invention. The oxide superconducting wire 1 is configured such that an outer periphery of an oxide superconductor 15 is covered with a plating layer (stabilizing layer) 17. In addition, the oxide superconductor 15 includes: an oxide superconducting laminate 16 that is formed by a tape-shaped substrate 10, an interlayer 11, and an oxide superconducting layer 12, in which the interlayer 11 and the oxide superconducting layer 12 are laminated on a main surface 10a of the substrate 10; and an undercoat stabilizing layer 20 that is laminated on an outer periphery of the oxide superconducting laminate 16. The undercoat stabilizing layer 20 includes: a first undercoat stabilizing layer 13 formed of Ag or an Ag alloy; and a second undercoat stabilizing layer 14 formed of one of Cu, Ni, Pb, Bi, and an alloy containing Cu, Ni, Pb or Bi as a major component.

Hereinafter, each component of the oxide superconducting wire 1 will be described in more detail based on FIG. 1.

The substrate 10 may be any one which can be usually used as a substrate of a typical oxide superconducting wire and preferably has an elongated tape shape having flexibility. In addition, it is preferable that a material used for the substrate 10 contains a metal having high mechanical strength and heat resistance that is easily processed into a wire. Examples of the material include various heat-resistant metal materials, for example, stainless steel and a nickel alloy such as HASTELLOY (trade name, manufactured by Haynes International, Inc.); and materials in which a ceramic is disposed on the above various metal materials. Among these, HASTELLOY is preferable as a commercially available product. Examples of the kinds of HASTELLOY include HASTELLOY B, C, G, N, and W containing different amounts of components such as molybdenum, chromium, iron, and cobalt. In the embodiment, any kinds of HASTELLOY can be used. In addition, as the substrate 10, for example, an oriented Ni—W alloy tape substrate in which a texture is introduced into a nickel alloy can be used. The thickness of the substrate 10 may be appropriately adjusted according to the intended use and is typically 10 μm to 500 μm and preferably 20 μm to 200 μm.

The interlayer 11 is formed on the main surface 10a of the substrate 10. In the interlayer 11, for example, a structure in which a diffusion preventing layer, a bed layer, a textured layer, and a cap layer are laminated in this order can be used.

When a heat treatment is performed to form other layers above the diffusion preventing layer, the substrate 10 and the other layers are affected by thermal history. In this case, the diffusion preventing layer prevents a part of the components of the substrate 10 from being diffused and incorporated into the oxide superconducting layer 12 side as impurities. A specific structure of the diffusion preventing layer is not particularly limited as long as it has the above-described function, and a single-layer structure or a multi-layer structure formed of $Al_2O_3$, $Si_3N_4$, or GZO ($Gd_2Zr_2O_7$) which has a relatively high effect of preventing impurity incorporation is preferable.

The bed layer is used to inhibit a reaction of a component at an interface between the substrate 10 and the oxide superconducting layer 12 and to improve the orientation of layers provided above the bed layer. A specific structure of the bed layer is not particularly limited as long as it has the above-described function, and a single-layer structure or a multi-layer structure formed of a rare earth oxide such as $Y_2O_3$, $CeO_2$, $La_2O_3$, $Dy_2O_3$, $Er_2O_3$, $Eu_2O_3$, or $Ho_2O_3$ which has high heat resistance is preferable.

The textured layer controls the crystal orientation of the cap layer and the oxide superconducting layer 12 formed above the textured layer, prevents the components of the substrate 10 from being diffused into the oxide superconducting layer 12, and alleviates a difference in physical characteristics such as a thermal expansion coefficient or a lattice constant between the substrate 10 and the oxide superconducting layer 12. A material of the textured layer is not particularly limited as long as it has the above-described function, and a metal oxide such as $Gd_2Zr_2O_7$, MgO, or $ZrO_2$—$Y_2O_3$ (YSZ) is particularly preferably used because a layer having high crystal orientation is obtained in an ion beam-assist deposition method (hereinafter, also referred to as "IBAD method") described below such that the crystal orientation of the cap layer and the oxide superconducting layer 12 can be further improved.

The cap layer controls the crystal orientation of the oxide superconducting layer 12 to be equal to or higher than that of the textured layer, prevents the elements constituting the oxide superconducting layer 12 from being diffused into the interlayer 11, and inhibits a reaction between the interlayer 11 and gas used during the lamination of the oxide superconducting layer 12. The material of the cap layer is not particularly limited as long as it has the above-described function, and a metal oxide such as $CeO_2$, $LaMnO_3$, $Y_2O_3$, $Al_2O_3$, $Gd_2O_3$, $ZrO_2$, YSZ, $Ho_2O_3$, or $Nd_2O_3$ is preferable from the viewpoint of lattice matching characteristics with the oxide superconducting layer 12. Among these, $CeO_2$ or $LaMnO_3$ is particularly preferable from the viewpoint of lattice matching characteristics with the oxide superconducting layer 12.

Here, when $CeO_2$ is used for the cap layer, the cap layer may contain a Ce-M-O-based oxide in which a portion of Ce is substituted with another metal atom or another metal ion.

The oxide superconducting layer 12 has a function of causing a current to flow in a superconducting state. As a material used for the oxide superconducting layer 12, a wide range of oxide superconductors having a well-known composition can be used. For example, a copper oxide superconductor such as a RE-123-based superconductor or a Bi-based superconductor is used. As the composition of the RE-123-based superconductor, for example, $REBa_2Cu_3O_{(7-x)}$ (RE represents a rare-earth element such as Y, La, Nd, Sm, Er, or Gd; and x represents oxygen deficiency) is used, and specific examples thereof include Y123 ($YBa_2Cu_3O_{(7-x)}$) and Gd123 ($GdBa_2Cu_3O_{(7-x)}$). As the composition of the Bi-based superconductor, for example, $Bi_2Sr_2$ $Ca_{n-1}Cu_nO_{4+2n+\delta}$ (n represents the number of $CuO_2$ layers, and δ represents excess oxygen) is used.

In addition, a material of the oxide superconducting layer 12 used in the embodiment is a copper oxide superconductor. Hereinafter, unless specified otherwise, a copper oxide superconductor is used as the material used for the oxide superconducting layer 12.

The oxide superconducting laminate 16 includes the substrate 10, the interlayer 11, and the oxide superconducting layer 12. As shown in FIG. 1, the outer periphery of the oxide superconducting laminate 16 is covered with the undercoat stabilizing layer 20, a main surface portion 13b of the first undercoat stabilizing layer 13 is formed on the oxide superconducting layer 12, and a main surface portion 14b of the second undercoat stabilizing layer 14 is formed on a back surface 10b of the substrate 10. Furthermore, side surface portions 13a and 14a of the first undercoat stabilizing layer 13 and the second undercoat stabilizing layer 14 are formed on a side surface 16a of the oxide superconducting laminate 16. As a result, the oxide superconductor 15 is configured.

The first undercoat stabilizing layer 13 has: the main surface portion 13b that is formed on the oxide superconducting layer 12 of the oxide superconducting laminate 16; and the side surface portion 13a that is formed on the side surface 16a of the oxide superconducting laminate 16. In addition, the first undercoat stabilizing layer 13 is not formed on the back surface 10b of the substrate 10.

The first undercoat stabilizing layer 13 has the following functions of: bypassing an overcurrent generated during trouble; inhibiting a chemical reaction that occurs between the oxide superconducting layer 12 and a layer provided above the first undercoat stabilizing layer 13; and preventing a decrease in superconducting characteristics due to composition disorder which is caused when a portion of elements of one layer infiltrates into another layer side. In addition, in order to easily introduce oxygen into the oxide superconducting layer 12, the first undercoat stabilizing layer 13 promotes permeation of oxygen during heating. The first undercoat stabilizing layer 13 is formed of a material containing Ag as a major component, for example, Ag or an Ag alloy.

The first undercoat stabilizing layer 13 formed of Ag or an Ag alloy can be formed using a film formation method such as a sputtering method. An example of forming the first undercoat stabilizing layer 13 using a sputtering method will be described below.

First, a target formed of Ag or an Ag alloy and the oxide superconducting laminate 16 are put into a treatment container which is evacuated into a vacuum and into which Ar gas is introduced. At this time, the oxide superconducting laminate 16 is disposed such that the oxide superconducting layer 12 is opposite the target. Next, by applying a voltage to the target to perform discharging, Ar gas is ionized to generate a plasma. Ar ions produced from the plasma sputter the target, sputtered particles of Ag are ejected from the target, and the sputtered particles are deposited on the oxide superconducting layer 12. As a result, the first undercoat stabilizing layer 13 is formed.

During the film formation using a sputtering method, in the first undercoat stabilizing layer 13, the sputtered particles (Ag particles) are also wrapped around the side surface sides of the substrate 10, the interlayer 11, and the oxide superconducting layer 12 so as to form the side surface portion 13a, as shown in FIG. 1. This is because the sputtered particles collide with Ar in the treatment container such that the motion direction thereof is changed. Accordingly, the side surface portion 13a of the first undercoat stabilizing layer 13 is thinner than the main surface portion 13b. In addition, the thickness of the side surface portion 13a gradually decreases in a direction away from the main surface portion 13b. If film formation conditions such as film formation pressure are met, a thin Ag layer (not shown) is formed on the back surface 10b side of the substrate 10.

The first undercoat stabilizing layer 13 is not particularly limited as long as it has the main surface portion 13b that is formed on at least the oxide superconducting layer 12 of the oxide superconducting laminate 16. The first undercoat stabilizing layer 13 may not have the side surface portion 13a that is formed on the side surface 16a of the oxide superconducting laminate 16.

The thickness of the main surface portion 13b formed on the oxide superconducting layer 12 of the first undercoat stabilizing layer 13 can be made to be 10 nm to 10 μm. When the thickness of the main surface portion 13b is 10 μm or less, the cost can be reduced. In addition, when the thickness of the main surface portion 13b is less than 10 nm, Ag may aggregate due to a heat treatment during oxygen annealing, a pinhole may be formed on the first undercoat stabilizing layer 13, and a portion of the oxide superconducting layer 12 may be exposed. Accordingly, the thickness of main surface portion 13b formed on the oxide superconducting layer 12 is preferably 10 nm to 10 μm. In addition, in order to more reliably prevent the exposure of the oxide superconducting layer 12, the thickness is more preferably 0.1 μm to 10 μm.

In addition, when there is no concern that Ag of the first undercoat stabilizing layer 13 may be diffused with Sn of a solder layer described below, the upper limit of the thickness range can be set as 2 μm from the viewpoint of further reducing the cost.

After the formation of the first undercoat stabilizing layer 13, a heat treatment is performed in an oxygen atmosphere at 300° C. to 500° C. for 5 hours to 20 hours (oxygen annealing treatment). The oxide superconducting layer 12 has an oxygen-deficient crystal structure after the formation. Therefore, by performing the oxygen annealing treatment, oxygen is supplied to the oxide superconducting layer 12, and the crystal structure thereof is adjusted.

The second undercoat stabilizing layer 14 has: the main surface portion 14b that is formed on the back surface 10b of the substrate 10; and the side surface portion 14a that is formed on the side surface 16a side of the oxide superconducting laminate 16.

The second undercoat stabilizing layer 14 can bypass an overcurrent during trouble together with the first undercoat stabilizing layer 13. The second undercoat stabilizing layer 14 is formed of one of Cu, Ni, Pb, Bi, and an alloy containing Cu, Ni, Pb or Bi as a major component. Examples of the Cu alloy include a Cu—Zn alloy and a Cu—Ni alloy.

Hereinafter, the method of forming the second undercoat stabilizing layer 14 formed of Cu will be described as an example. As in the case of the first undercoat stabilizing layer 13, the second undercoat stabilizing layer 14 formed of Cu can be formed using a sputtering method. A Cu target is disposed opposite to the back surface 10b of the substrate 10, and the second undercoat stabilizing layer 14 is formed on the substrate 10. At this time, the second undercoat stabilizing layer 14 is formed in which, as shown in FIG. 1, the sputtered particles (Cu particles) are wrapped not only around the back surface 10b of the substrate 10 but also around the side surface sides of the substrate 10, the interlayer 11, and the oxide superconducting layer 12. The side surface portion 13a of the first undercoat stabilizing layer 13 is formed on the side surfaces of the substrate 10, the interlayer 11, and the oxide superconducting layer 12.

Therefore, the side surface portion 14a of the second undercoat stabilizing layer 14 is formed on the side surface portion 13a of the first undercoat stabilizing layer 13.

The side surface portion 13a of the first undercoat stabilizing layer 13 that is formed on the side surfaces of the substrate 10, the interlayer 11, and the oxide superconducting layer 12 is thin. Therefore, due to the oxygen annealing treatment, Ag may aggregate, and a pinhole may be formed on the side surface portion 13a. However, in the embodiment, the side surface portion 14a of the second undercoat stabilizing layer 14 is formed on the side surface portion 13a of the first undercoat stabilizing layer 13, and thus the pinhole is covered. Accordingly, the oxide superconducting laminate 16 can be completely covered with the undercoat stabilizing layer 20 including the first undercoat stabilizing layer 13 and the second undercoat stabilizing layer 14.

The thickness of the main surface portion 14b of the second undercoat stabilizing layer 14 can be made to be 10 nm to 10 µm. When it is attempted to form the main surface portion 14b having a thickness of more than 10 µm, oxygen which has been supplied to the oxide superconducting layer 12 due to the oxygen annealing treatment may be activated by heat during the formation and may be separated from the oxide superconducting layer 12.

When sputtered particles collide with a film formation object during film formation using a sputtering method, the kinetic energy during the collision is converted into thermal energy, and the surface of the film formation object is heated. When the second undercoat stabilizing layer 14 is formed using a sputtering method, the back surface 10b of the substrate 10 is also heated due to the formation.

The amount of heat generated has a correlation with the thickness of the second undercoat stabilizing layer 14 to be formed. When the thickness of the second undercoat stabilizing layer 14 is 10 µm or more, the heat is transferred to the oxide superconducting layer 12, and oxygen in the oxide superconducting layer 12 is activated and separated. Accordingly, the thickness of the second undercoat stabilizing layer 14 is preferably 10 µm or less.

In addition, when the thickness of the second undercoat stabilizing layer 14 formed on the substrate 10 is less than 10 nm, the oxide superconducting laminate 16 cannot be completely covered with the second undercoat stabilizing layer 14 and the first undercoat stabilizing layer 13 formed on the oxide superconducting laminate 16. Therefore, the thickness of the second undercoat stabilizing layer 14 is preferably 10 nm or more.

The side surface portion 13a of the first undercoat stabilizing layer 13 of FIG. 1 completely covers the side surface 16a of the oxide superconducting laminate 16. In addition, the side surface portion 14a of the second undercoat stabilizing layer 14 also completely covers the side surface portion 13a of the first undercoat stabilizing layer 13. However, either the side surface portion of 13a of the first undercoat stabilizing layer 13 or the side surface portion 14a of the second undercoat stabilizing layer 14 may cover the surface of the oxide superconducting laminate 16.

The outer periphery of the oxide superconducting laminate 16 is covered with the first undercoat stabilizing layer 13 and the second undercoat stabilizing layer 14. As a result, the amount of Ag used can be limited, and the cost can be reduced as compared to a case where the outer periphery is covered with only the first undercoat stabilizing layer 13 containing Ag as a major component.

As described above, the oxide superconductor 15 includes: the oxide superconducting laminate 16 that includes the substrate 10, the interlayer 11, and the oxide superconducting layer 12; and the undercoat stabilizing layer 20 that covers the outer periphery of the oxide superconducting laminate 16. The undercoat stabilizing layer 20 includes the first undercoat stabilizing layer 13 and the second undercoat stabilizing layer 14. The main surface portion 13b of the first undercoat stabilizing layer 13 is formed on the oxide superconducting layer 12 of the oxide superconducting laminate 16, the main surface portion 14b of the second undercoat stabilizing layer 14 is formed on a back surface 10b of the substrate 10, and at least one of the side surface portion 13a of the first undercoat stabilizing layer 13 and the side surface portion 14a of the second undercoat stabilizing layer 14 is formed on the side surfaces 16a and 16a of the oxide superconducting laminate 16.

In addition, the oxide superconductor 15 and the plating layer (stabilizing layer) 17, which air-tightly covers the outer periphery of the oxide superconductor 15, constitute the oxide superconducting wire 1.

The substrate 10 and the oxide superconducting layer 12 have poorer plating adhesion as compared to the first undercoat stabilizing layer 13 or the second undercoat stabilizing layer 14. In addition, the substrate 10 and the oxide superconducting layer 12 at room temperature have a significantly higher electrical resistances value as compared to the first undercoat stabilizing layer 13 or the second undercoat stabilizing layer 14. Therefore, it is difficult to form a plating layer having a uniform thickness on the surfaces of the substrate 10 and the oxide superconducting layer 12 using electroplating.

However, the oxide superconducting laminate 16 according to the embodiment is completely covered with the first undercoat stabilizing layer 13 and the second undercoat stabilizing layer 14. Therefore, the plating layer 17 is formed only on the first undercoat stabilizing layer 13 or the second undercoat stabilizing layer 14. Accordingly, the plating layer 17 of the outer periphery of the oxide superconductor 15 is superior in the adhesion with the oxide superconductor 15. Furthermore, since a difference in electrical resistance value between the first undercoat stabilizing layer 13 and the second undercoat stabilizing layer 14 is relatively small, the plating layer 17 having a uniform thickness can be formed.

The plating layer 17 laminated on the oxide superconductor 15 is formed of a highly conductive metal material. When the oxide superconducting layer 12 is transitioned from a superconducting state to a normal conducting state for some reason, the plating layer 17 and the undercoat stabilizing layer 20 function as a stabilizing layer which is a bypass for commutating the current of the oxide superconducting layer 12.

In addition, due to the plating layer 17, the oxide superconductor 15 can be completely blocked from the outside, and moisture infiltration can be more reliably prevented.

Examples of a metal used for the plating layer 17 include copper, nickel, gold, silver, chromium, and tin. Among these metals, one kind or a combination of two or more kinds thereof may be used.

In addition, when the oxide superconducting wire 1 is used as a superconducting fault current limiter, the plating layer (stabilizing layer) 14 is used to instantly prevent an overcurrent which is generated when the oxide superconducting wire 1 is transitioned to a normal conducting state due to quenching. Examples of a material which is used in the plating layer 17 for this use include a high-resistance metal, for example, a Ni-based alloy such as a Ni—Cr alloy.

The thickness of the plating layer 17 is not particularly limited and can be appropriately adjusted to be, for example, 10 µm to 100 µm. When the thickness of the plating layer 17 is less than 10 μm, a pinhole may be formed on the plating layer 17, and moisture infiltration may not be reliably prevented. In addition, it is not preferable that the thickness of the plating layer 17 exceeds 100 μm because the thickness of the oxide superconducting wire 1 excessively increases, and the flexibility decreases. Accordingly, the thickness of the plating layer is preferably 10 μm to 100 μm.

Modification Example of First Embodiment of Oxide Superconducting Wire

Figure 2:
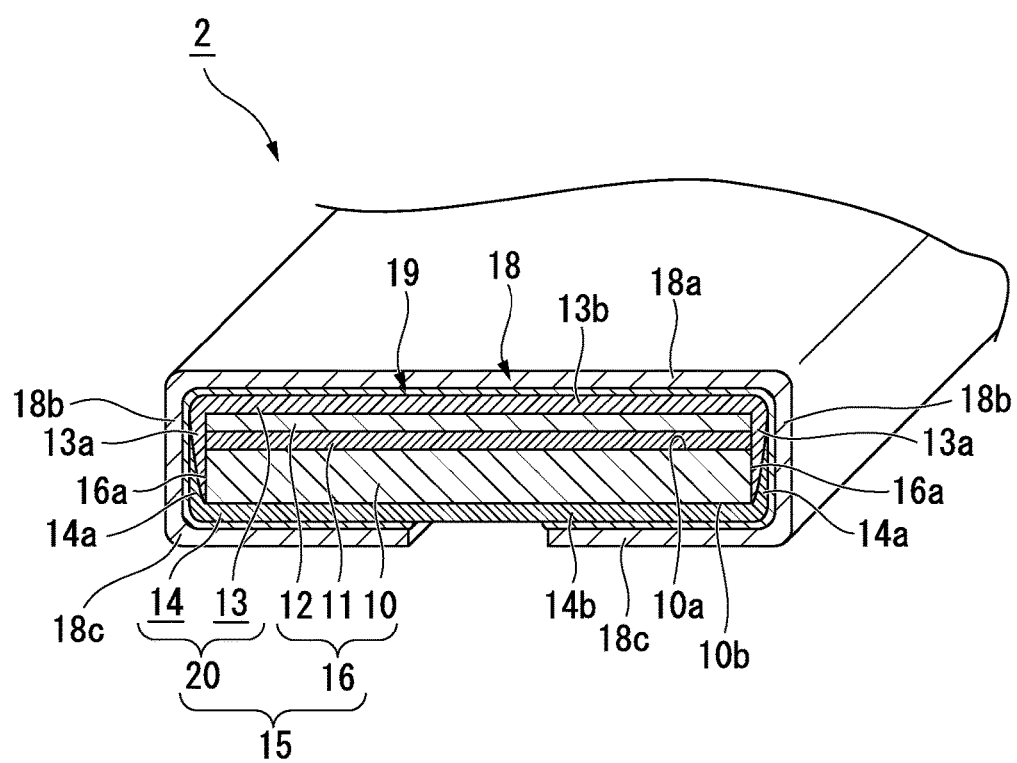
FIG. 2 is a cross-sectional view schematically showing a modification example of the oxide superconducting wire according to the first embodiment of the present invention.

FIG. 2 is a schematic diagram showing an oxide superconducting wire 2 which is a modification example of the above-described first embodiment of the present invention. The same components as those of the above-described embodiment are represented by the same reference numerals, and a description thereof will not be repeated.

When the oxide superconducting wire 2 is compared to the oxide superconducting wire 1 according to the above-described first embodiment, there is a difference in the configuration of a covering of the outer periphery of the oxide superconductor 15.

That is, the oxide superconducting wire 2 of the modification example includes: the oxide superconductor 15; and a metal tape (stabilizing layer) 18 that air-tightly covers an outer periphery of the oxide superconductor 15.

The oxide superconducting wire 2 is formed through the following steps of: disposing the oxide superconductor 15 on a surface of the metal tape 18 provided with a solder layer 19; bending a peripheral surface of the oxide superconductor 15 so as to form an approximately C shape in cross-section; heating and melting the solder layer 19; and compressing the oxide superconductor 15 with a roller.

The metal tape 18 is bent in an approximately C shape in cross-section, has a front-surface wall 18a, a side wall 18b, and a back-surface wall 18c, and covers a region ranging from the oxide superconducting layer 12 of the oxide superconductor 15 to a portion of the substrate 10. In addition, the solder layer 19 is formed on an inner peripheral surface side of the metal tape 18.

As described above, the oxide superconductor 15 is covered with the metal tape 18 such that an air-tight structure capable of preventing moisture infiltration can be realized.

In the modification example, the solder layer 19 of the metal tape 18 is formed on only the surface (inner surface) in contact with the oxide superconductor 15. However, the solder layer 19 may be provided on both surfaces of the metal tape 18.

Also, in addition to the method in which the oxide superconductor 15 is covered with the metal tape 18 in an approximately C shape, the outer periphery of the oxide superconductor 15 may be air-tightly covered by spiral winding or the like with the metal tape 18 provided with the solder layer 19.

The metal material constituting the metal tape 18 is not particularly limited as long as it has high conductivity. It is preferable that the metal tape 18 is formed of a relatively cheap material, for example, copper, a copper alloy such as brass (Cu—Zn alloy) or a Cu—Ni alloy, or stainless steel. It is more preferable that the metal tape 18 is formed of copper because copper has high conductivity and cheap. In addition, when the oxide superconducting wire 2 is used in a superconducting fault current limiter, it is preferable that a high-resistance metal, for example, a Ni-based alloy such as a Ni—Cr alloy is used as the material used for the metal tape 18.

The thickness of the metal tape 18 is not particularly limited and can be appropriately adjusted to be, for example, 9 μm to 60 μm. When the thickness of the metal tape 18 is excessively small, the metal tape 18 may be torn off. When the thickness of the metal tape 18 is excessively large, it is difficult to form the metal tape 18 in an approximately C shape in cross-section, and it is necessary to apply high stress during formation. Therefore, the oxide superconducting layer 12 may deteriorate.

A solder used in the solder layer 19 is not particularly limited, and a well-known solder of the related art can be used. Examples of the solder include a lead-free solder formed of an alloy containing Sn as a major component such as a Sn—Ag-based alloy, a Sn—Bi-based alloy, a Sn—Cu-based alloy, or a Sn—Zn-based alloy; a Pb—Sn-based alloy solder; a eutectic solder; and a low-temperature solder. Among these solders, one kind or a combination of two or more kinds thereof can be used. Among these, a solder having a melting point of 300° C. or lower is preferably used. As a result, the metal tape 18 can be soldered to the first undercoat stabilizing layer 13 or the second undercoat stabilizing layer 14 at a temperature of 300° C. or lower. Therefore, a decrease in the characteristics of the oxide superconducting layer 12 caused by soldering heat can be limited.

In the oxide superconducting wire 2 shown in the modification example, the metal tape 18 can function as a stabilizing layer which is a bypass commutating for the current of the oxide superconducting layer 12. In addition, due to the metal tape 18, the oxide superconductor 15 can be completely blocked from the outside, and moisture infiltration can be more reliably prevented.

In the oxide superconducting wire 2 shown as the modification example, the outer periphery of the oxide superconducting laminate 16 is covered with the first undercoat stabilizing layer 13 or the second undercoat stabilizing layer 14 having superior adhesion with the solder so as to form the oxide superconductor 15. Therefore, the solder layer 19 and the oxide superconductor 15 can easily adhere to each other to form the oxide superconducting wire 2 having high air-tightness.

Second Embodiment of Oxide Superconducting Wire

Figure 3:
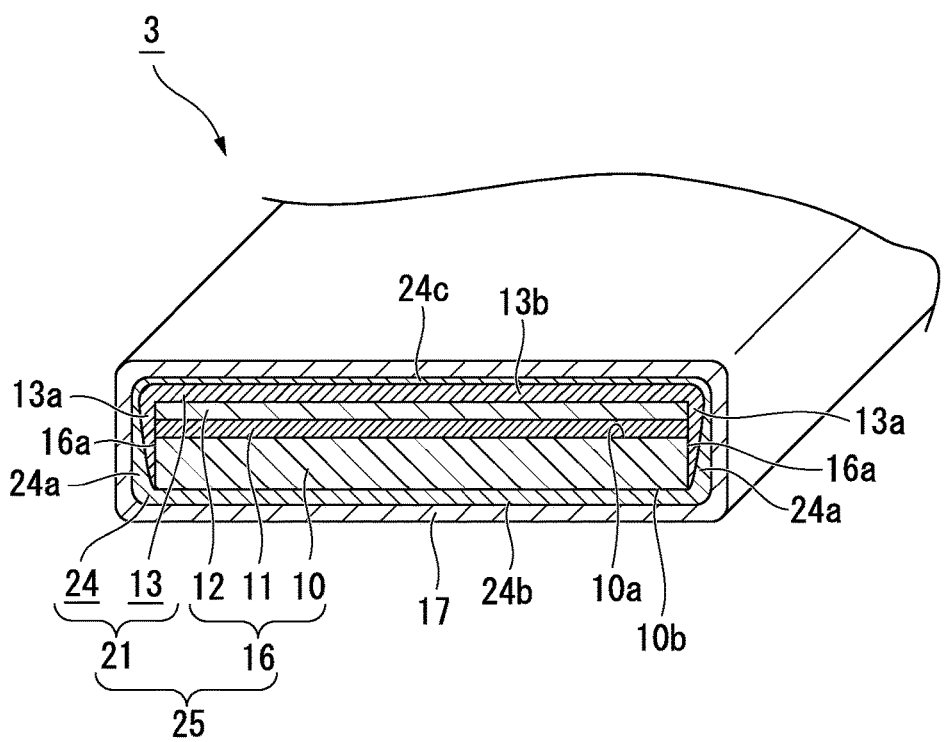
FIG. 3 is a cross-sectional view schematically showing an oxide superconducting wire according to a second embodiment of the present invention.

Hereinafter, an oxide superconducting wire 3 according to a second embodiment of the present invention will be described based on FIG. 3. The same components as those of the above-described first embodiment are represented by the same reference numerals, and the description thereof will not be repeated.

When the oxide superconducting wire 3 according to the second embodiment is compared to the oxide superconducting wire 1 according to the first embodiment, there is a difference in a configuration of an undercoat stabilizing layer 21, particularly in a configuration of a second undercoat stabilizing layer 24. That is, as shown in FIG. 3, in the oxide superconducting wire 3 according to the second embodiment, the second undercoat stabilizing layer 24 is formed so as to cover the entire outer periphery of the oxide superconducting laminate 16 in which the first undercoat stabilizing layer 13 is formed.

In this embodiment, the outer periphery of an oxide superconductor 25 is covered with the plating layer 17 to constitute the oxide superconducting wire 3. However, as in the case of the oxide superconducting wire 2 (refer to FIG. 2) which is the modification example of the first embodiment, a structure in which the outer periphery of the oxide superconductor 25 is covered with the metal tape 18 with the solder layer 19 interposed therebetween may be adopted.

As in the case of the above-described first embodiment, the second undercoat stabilizing layer 24 can be formed using a film formation method such as a sputtering method. As in the case of a side surface portion 24a, a back surface portion 24c of the second undercoat stabilizing layer 24 formed on the main surface portion 13b of the first undercoat stabilizing layer 13 is formed through the following procedures: the sputtered particles collide with Ar in the treatment container such that the motion direction thereof is changed; and the sputtered particles are wrapped around a side where the oxide superconducting layer 12 of the oxide superconducting laminate 16 is laminated.

The back surface portion 24c can be formed by increasing the Ar pressure (film formation pressure) in the treatment container when the second undercoat stabilizing layer 24 is formed using a sputtering method. Specifically, the back surface portion 24c can be formed by increasing the film formation pressure to be 0.5 Pa or higher. However, when the film formation pressure increases, the film formation rate decreases, which may increase the cost. Therefore, the film formation pressure is preferably 10 Pa or lower.

The thickness of a main surface portion 24b of the second undercoat stabilizing layer 24 can be made to be 10 nm to 10 µm as in the case of the thickness of the main surface portion 14b of the second undercoat stabilizing layer 14 in the oxide superconducting wire 1 according to the first embodiment. When there is an attempt to form the main surface portion 24b having a thickness of more than 10 µm, oxygen which has been supplied to the oxide superconducting layer 12 due to the oxygen annealing treatment may be activated by heat during the formation and may be separated from the oxide superconducting layer 12.

In addition, the second undercoat stabilizing layer 24 according to the second embodiment is formed not only on the back surface 10b of the substrate 10 and the side surface portion 13a of the first undercoat stabilizing layer 13 but also on the main surface portion 13b of the first undercoat stabilizing layer 13. Furthermore, the side surface portion 24a and the back surface portion 24c of the second undercoat stabilizing layer 24 that are formed on the side surface portion 13a and the main surface portion 13b of the first undercoat stabilizing layer 13 are formed when the sputtered particles collide with Ar in the treatment container such that the motion direction thereof is changed during the film formation using a sputtering method. Therefore, the sputtered particles lost most of the kinetic energy during the collision with Ar, and thus the thermal energy generated during the lamination is small. Accordingly, a thermal effect caused by the formation of the back surface portion 24c is very small. As in the case of the second undercoat stabilizing layer 14 according to the first embodiment, the thickness of the main surface portion 24b is preferably 10 µm or less because there is no concern of oxygen separation.

In addition, when the thickness of the second undercoat stabilizing layer 24 formed on the substrate 10 is less than 10 nm, the oxide superconducting laminate 16 cannot be completely covered with the second undercoat stabilizing layer 24 and the first undercoat stabilizing layer 13 formed on the oxide superconducting laminate 16. Therefore, the thickness of the second undercoat stabilizing layer 24 is preferably 10 nm or more.

As described above, due to the wrapping of the sputtered particles, the back surface portion 24c of the second undercoat stabilizing layer 24 is formed, and a step of forming the main surface portion 24b and a step of forming the back surface portion 24c can be separately performed. That is, after disposing the back surface 10b of the substrate 10 of the oxide superconducting laminate 16 opposite to the target to form the main surface portion 24b, the main surface portion 13b side of the first undercoat stabilizing layer 13 of the oxide superconducting laminate 16 may be disposed opposite to the target to form the back surface portion 24c.

However, when the first undercoat stabilizing layer 13 is heated by the oxygen annealing treatment, Ag atoms of the first undercoat stabilizing layer 13 may locally aggregate on the surface of the oxide superconducting layer 12 to form isolated and dispersed plural aggregates of Ag particles. As a result, a pinhole may be formed on the first undercoat stabilizing layer 13, and the oxide superconducting layer 12 may be exposed.

When the plating layer 17 is formed on the first undercoat stabilizing layer 13, an acidic plating solution comes into contact with the oxide superconducting layer 12 at the exposed portion. Therefore, the oxide superconducting layer 12 may be corroded to cause a decrease in superconducting characteristics.

In the embodiment, the first undercoat stabilizing layer 13 is completely covered with the second undercoat stabilizing layer 24. Therefore, even when a pinhole is formed on the first undercoat stabilizing layer 13, a decrease in superconducting characteristics caused by the formation of the plating layer 17 does not occur.

In addition, the outer periphery of the oxide superconductor 25 according to the embodiment is completely covered with the second undercoat stabilizing layer 24, and the plating layer 17 is formed on the second undercoat stabilizing layer 24. Accordingly, the plating layer 17 of the outer periphery of the oxide superconductor 25 has superior adhesion with the oxide superconductor 25 and has a uniform thickness.

Modification Example of Second Embodiment of Oxide Superconducting Wire

In the oxide superconducting wire 3 according to the second embodiment, the outer periphery of the oxide superconductor 25 may be covered with the metal tape 18, instead of the plating layer 17, with the solder layer 19 interposed therebetween.

Figure 4:
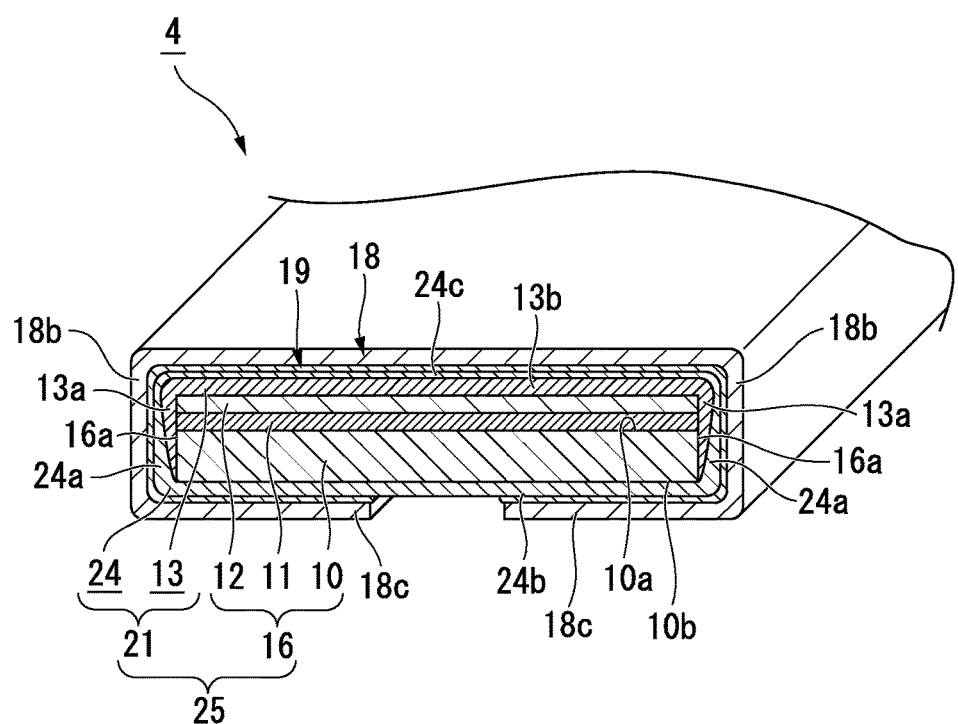
FIG. 4 is a cross-sectional view schematically showing a modification example of the oxide superconducting wire according to the second embodiment of the present invention.

FIG. 4 is a schematic diagram showing an oxide superconducting wire 4 which is a modification example of the above-described second embodiment of the present invention. The oxide superconductor 25 and the metal tape 18, which air-tightly covers the outer periphery of the oxide superconductor 25, constitute the oxide superconducting wire 4. The same components as those of the above-described embodiment are represented by the same reference numerals, and a description thereof will not be repeated.

The outer periphery of the oxide superconductor 25 is covered with the second undercoat stabilizing layer 24 having superior adhesion with the solder. The oxide superconductor 25 can easily adhere to the metal tape 18 through the solder layer 19 to form the oxide superconducting wire 4.

In addition, in a case where the metal tape is directly soldered to the first undercoat stabilizing layer, when a pinhole is formed on the first undercoat stabilizing layer 13, superconducting characteristics may decrease due to a reaction between the solder and the oxide superconducting layer 12. In the oxide superconducting wire 4, the first undercoat stabilizing layer 13 is completely covered with the second undercoat stabilizing layer 24. Therefore, even when a pinhole is formed on the first undercoat stabilizing layer 13, a decrease in superconducting characteristics caused by the use of the solder does not occur.

From the viewpoint of limiting an increase in the interface resistance value between the oxide superconducting layer 12 and the first undercoat stabilizing layer 13, the thickness of the back surface portion 24c of the second undercoat stabilizing layer 24 is preferably 0.1 μm to 5 μm. When the thickness of the back surface portion 24c of the second undercoat stabilizing layer 24 is less than 0.1 μm, Cu of the second undercoat stabilizing layer 24 and Sn of the solder layer 19 form an alloy, which may decrease the adhesion between the first undercoat stabilizing layer 13 and the second undercoat stabilizing layer 24.

When the metal tape 18 is directly soldered to the first undercoat stabilizing layer 13, metal (for example, Sn) constituting the solder layer 19 is diffused into the first undercoat stabilizing layer 13, and Ag and metal constituting the solder forms an alloy in the first undercoat stabilizing layer 13. The embedding of the metal constituting the solder layer 19 is limited to a region of the first undercoat stabilizing layer 13 near the interface with the solder layer 19. However, when the first undercoat stabilizing layer 13 is formed to be thin (for example, 2 μm or less), an alloy is formed through the entire thickness of the first undercoat stabilizing layer 13. When an alloy is formed in the entire first undercoat stabilizing layer 13, the interface state between the first undercoat stabilizing layer 13 and the oxide superconducting layer 12 is changed, and the interface resistance between the oxide superconducting layer 12 and the first undercoat stabilizing layer 13 increases.

In Sample 1, the first undercoat stabilizing layer was formed on the oxide superconducting layer, and the solder layer formed of Sn was formed on the first undercoat stabilizing layer. In Sample 2, only the first undercoat stabilizing layer was formed on the oxide superconducting layer. In Sample 3, the second undercoat stabilizing layer was formed on the first undercoat stabilizing layer formed on the oxide superconducting layer, and the solder layer formed of Sn was formed on the second undercoat stabilizing layer. Table 1 shows the results of comparing the interface resistance values between the oxide superconducting layers and the first undercoat stabilizing layers in Samples 1, 2, and 3. The widths of the wires were 10 mm, and the lengths of regions of the wires where the interface resistance value was measured were 20 mm. The thicknesses of the first undercoat stabilizing layers of Samples 1 to 3 were 2 μm, and the thickness of the second undercoat stabilizing layer of Sample 3 was 1 μm.

TABLE 1

| Configuration | | Interface Resistance Value ($\eta\Omega$) between Oxide Superconducting Layer and First Undercoat Stabilizing Layer |
|---|---|---|
| Sample 1 | Oxide Superconducting Layer + First Undercoat Stabilizing Layer + Solder Layer | 520 |
| Sample 2 | Oxide Superconducting Layer + First Undercoat Stabilizing Layer | 135 |
| Sample 3 | Oxide Superconducting Layer + First Undercoat Stabilizing Layer + Second Undercoat Stabilizing Layer + Solder Layer | 138 |

It can be seen from Table 1 that, when the thickness of the first undercoat stabilizing layer 13 is 2 μm or less, and when the solder layer is directly soldered to the first undercoat stabilizing layer 13, the interface resistance value between the oxide superconducting layer and the first undercoat stabilizing layer 13 is significantly increased. The reason is considered to be as follows: Sn is embedded into the first undercoat stabilizing layer 13, an Ag—Sn alloy is formed in the first undercoat stabilizing layer 13, and the interface state between the first undercoat stabilizing layer 13 and the oxide superconducting layer 12 is changed.

In addition, it can be seen that, even when the thickness of the first undercoat stabilizing layer 13 is 2 μm or less, the interface resistance value between the oxide superconducting layer 12 and the first undercoat stabilizing layer 13 does not increase by providing the second undercoat stabilizing layer 24 between the first undercoat stabilizing layer and the solder layer.

In the oxide superconducting wire 4, the first undercoat stabilizing layer 13 is completely covered with the second undercoat stabilizing layer 24. Therefore, the solder layer 19 does not come into contact with the first undercoat stabilizing layer 13. Accordingly, the solder is not embedded into the first undercoat stabilizing layer 13 to form an alloy with Ag. Therefore, as shown in Table 1, an increase in the interface resistance value between the first undercoat stabilizing layer 13 and the oxide superconducting layer 12 can be limited.

Furthermore, when the thickness of the first undercoat stabilizing layer 13 is 2 μm or less, Ag is embedded with Sn of the solder layer, and thus an Ag—Sn alloy is formed in the entire first undercoat stabilizing layer 13. In this case, since the adhesion between Sn and the oxide superconducting layer 12 is poor, the metal tape 18 is peeled off. However, in the above-described configuration, the second undercoat stabilizing layer 24 provided between the first undercoat stabilizing layer 13 and the solder layer 19 functions as a Sn diffusion preventing layer. Therefore, Ag is not embedded with Sn of the solder layer, and the adhesion of the metal tape 18 can be secured.

EXAMPLES

Hereinafter, the present invention will be described in more detail using examples. However, the present invention is not limited to these examples.

(Preparation of Samples)

First, a surface of a tape-shaped substrate formed of HASTELLOY C-276 (trade name, manufactured by Haynes International, Inc.) and having a width of 10 mm, a thickness of 0.1 mm, and a length of 1000 mm was polished using alumina having an average particle size of 3 μm. Next, the surface of the substrate was degreased and washed with acetone.

An $Al_2O_3$ layer (diffusion preventing layer; thickness: 100 nm) was formed on a main surface of the substrate using a sputtering method, and an $Y_2O_3$ layer (bed layer; thickness: 30 nm) was formed thereon using an ion beam sputtering method.

Next, an MgO layer (metal oxide layer; thickness: 5 nm to 10 nm) was formed on the bed layer using an ion beam-assist deposition method (IBAD method), and a $CeO_2$ layer (cap layer) having a thickness of 500 nm was formed thereon using a pulse laser deposition method (PLD method). Next, a $GdBa_2Cu_3O_{7-\delta}$ layer (oxide superconducting layer) having a thickness of 2.0 μm was formed on the $CeO_2$ layer.

Furthermore, a first undercoat stabilizing layer of Ag having a thickness of 2 μm was formed on the oxide superconducting layer from the oxide superconducting layer side. The laminate was annealed with oxygen in an oxygen atmosphere in a furnace at 500° C. for 10 hours, was cooled in the furnace for 26 hours, and was extracted from the furnace.

Next, a second undercoat stabilizing layer of Cu having a thickness of 1 μm was formed on the substrate using a sputtering method from the back surface side of the substrate. As a result, an oxide superconductor was obtained. This oxide superconductor was used in both of the following Examples 1 and 2.

Example 1

Using a plating method, a plating layer was formed on an outer periphery of the oxide superconductor obtained through the above-described procedure. As a result, an oxide superconducting wire of Example 1 having the same structure as that of the oxide superconducting wire 1 shown in FIG. 1 was prepared.

Regarding the procedure of the plating method, a coil was unwound from the above-described coil-wound oxide superconductor, and the oxide superconductor was dipped in a copper sulfate aqueous solution in the process of rewinding the oxide superconductor using the unwound coil, thereby performing electroplating. As a result, a plating layer formed of Cu and having a thickness of 75 μm was formed. In the electroplating, the current density of the plating object (oxide superconductor) was set to be 5 A/dm$^2$, and plating conditions were set to be a plating bath temperature of 25° C. and a dipping time of 18 minutes.

Example 2

An outer periphery of the oxide superconductor obtained through the above-described procedure was covered with a metal tape with a solder layer interposed therebetween. As a result, an oxide superconducting wire of Example 2 having the same structure as that of the oxide superconducting wire 2 shown in FIG. 2 was prepared.

First a metal tape formed of Cu and having a width of 10 mm, a thickness of 50 μm, and a length of 1000 mm was prepared in which a Sn plating layer (melting point: 230° C.; solder layer) having a thickness of 5 μm was formed on a single surface. The oxide superconductor was disposed on the Sn-plated surface of the metal tape such that a longitudinal direction matches with that of the metal tape and such that the first undercoat stabilizing layer is opposite to the Sn-plated surface of the metal tape. The laminate was caused to pass through a heating and press roller such that Sn on the metal tape was melted to form a solder layer. As a result, the first undercoat stabilizing layer and the metal tape in the oxide superconductor are adhered to each other.

Next, both ends of the metal tape in the width direction were bent in a U shape, and both the ends of the metal tape were further bent to the substrate back surface side and molded so as to form an approximately C shape in cross-section.

Next, the laminate was caused to pass through the heating and press roller again such that Sn on the metal tape was melted to form a solder layer. As a result, a side end portion of the oxide superconductor and a portion of the substrate are adhered to each other through the metal tape. Due to this heating and pressing treatment using the heating and press roller, a gap between the metal tape and the oxide superconductor provided inside the metal tape was embedded with Sn. As a result, the oxide superconducting wire of Example 2 having the same structure as that of the oxide superconducting wire shown in FIG. 2 was obtained.

As the heating and press roller, a silicon roller was used, and the heating and pressing treatment was performed under conditions of a heating temperature of 240° C., an applied pressure of 10 MPa to 20 MPa, and a wire transport rate of 100 m/h.

Regarding Examples 1 and 2, a pressure cooker test of leaving a sample to stand in a high-temperature (120° C.), high-humidity (100%), and high-pressure (2 atm) environment for 100 hours was performed to measure a ratio of the critical current density values before and after the standing. The ratio of the critical current density value (Ic) after the standing to the critical current density value ($Ic_0$) before the standing was obtained as $Ic/Ic_0$. It was verified that, in both Examples 1 and 2, $Ic/Ic_0$ was 1.0, and superconducting characteristics were not poor even under strict conditions as in the pressure cooker test.

DESCRIPTION OF THE REFERENCE NUMBER

1, 2, 3, 4: OXIDE SUPERCONDUCTING WIRE
10: SUBSTRATE
10*a*: MAIN SURFACE
10*b*: BACK SURFACE
11: INTERLAYER
12: OXIDE SUPERCONDUCTING LAYER
13: FIRST UNDERCOAT STABILIZING LAYER
13*a*, 14*a*, 24*a*: SIDE SURFACE PORTION
13*b*, 14*b*, 24*b*: MAIN SURFACE PORTION
14, 24: SECOND UNDERCOAT STABILIZING LAYER
15, 25: OXIDE SUPERCONDUCTOR
16: OXIDE SUPERCONDUCTING LAMINATE
16*a*: SIDE SURFACE
17: PLATING LAYER (STABILIZING LAYER)
18: METAL TAPE (STABILIZING LAYER)
19: SOLDER LAYER
20, 21: UNDERCOAT STABILIZING LAYER
24*c*: BACK SURFACE PORTION

The invention claimed is:
1. An oxide superconducting wire comprising:
an oxide superconducting laminate that includes a substrate, an interlayer, and an oxide superconducting layer, in which the interlayer is formed on a main surface of the substrate, and the oxide superconducting layer is formed on the interlayer;
an undercoat stabilizing layer that includes a first undercoat stabilizing layer and a second undercoat stabilizing layer and is formed on an outer periphery of the oxide superconducting laminate, the first undercoat stabilizing layer being formed of Ag or an Ag alloy as a major component, the first undercoat stabilizing layer covering at least an upper surface and side surfaces of the oxide superconducting layer, the first undercoat stabilizing layer being configured to promote permeation of oxygen during heating, the second undercoat stabilizing layer being formed of one of Cu, Ni, and an alloy containing Cu, or Ni as a major component, and the second undercoat stabilizing layer covering at least a back surface and the side surfaces of the substrate; and
a stabilizing layer that is formed on the undercoat stabilizing layer so as to cover at least a portion of the first undercoat stabilizing layer and a portion of the second undercoat stabilizing layer in the undercoat stabilizing layer, wherein:
the first undercoat stabilizing layer and the second undercoat stabilizing layer partially overlap each other in an overlapping portion on the side surfaces of the oxide superconducting laminate,
the first undercoat stabilizing layer has a first main surface portion and a first side surface portion,
the second undercoat stabilizing layer has a second main surface portion and a second side surface portion,
the first side surface portion of the first undercoat stabilizing layer is disposed on a side surface in the side surfaces of the oxide superconducting laminate,
the second side surface portion of the second undercoat stabilizing layer is disposed on the first side surface portion of the first undercoat stabilizing layer,
the first side surface portion is disposed inside the overlapping portion,
the second side surface portion is disposed outside the overlapping portion,
the first main surface portion of the first undercoat stabilizing layer is opposite to the second main surface portion of the second undercoat stabilizing layer with the oxide superconducting laminate interposed therebetween,
the first side surface portion is thinner than the first main surface portion,
a thickness of the first side surface portion gradually decreases in a direction away from the first main surface portion, the second side surface portion is thinner than the second main surface portion, and a thickness of the second side surface portion gradually decreases in a direction away from the second main surface portion.

2. The oxide superconducting wire according to claim 1, wherein the second undercoat stabilizing layer is formed to cover an entire exposed surface of the first undercoat stabilizing layer.

3. The oxide superconducting wire according to claim 2, wherein a thickness of the first undercoat stabilizing layer on the upper surface of the oxide superconducting layer is 0.1 μm to 2 μm.

4. The oxide superconducting wire according to claim 3, wherein the stabilizing layer is one of a plating layer and a metal tape.

5. The oxide superconducting wire according to claim 2, wherein the stabilizing layer is one of a plating layer and a metal tape.

6. The oxide superconducting wire according to claim 1, wherein the stabilizing layer is one of a plating layer and a metal tape.

7. The oxide superconducting wire according to claim 1, wherein the first undercoat stabilizing layer is not formed on the back surface of the substrate.

8. The oxide superconducting wire according to claim 1, wherein an end portion of the first side surface portion in the first undercoat stabilizing layer is formed on the side surface of the oxide superconducting laminate.

9. The oxide superconducting wire according to claim 1, wherein the second undercoat stabilizing layer is not formed on the upper surface of the oxide superconducting layer.

10. The oxide superconducting wire according to claim 1, wherein:
the first main surface portion of the first undercoat stabilizing layer is disposed on the upper surface of the oxide superconducting layer, and
the second main surface portion of the second undercoat stabilizing layer is disposed on the back surface of the substrate.

* * * * *